United States Patent [19]
Schrantz et al.

[11] Patent Number: 5,561,303
[45] Date of Patent: Oct. 1, 1996

[54] SILICON ON DIAMOND CIRCUIT STRUCTURE

[75] Inventors: Gregory A. Schrantz; Stephen J. Gaul, both of Melbourne, Fla.

[73] Assignee: Harris Corporation, Melbourne, Fla.

[21] Appl. No.: 248,844

[22] Filed: May 25, 1994

Related U.S. Application Data

[63] Continuation of Ser. No. 789,219, Nov. 7, 1991, abandoned.

[51] Int. Cl.$^6$ .................. H01L 31/0312; H01L 29/04; H01L 31/036
[52] U.S. Cl. ............... 257/77; 257/49; 257/51; 257/524
[58] Field of Search ............. 357/23.15; 257/49, 257/51, 64, 65, 66, 67, 77, 50, 52, 57, 349, 524, 525, 526, 527, 505, 506, 508, 256, 266; 437/29

[56] References Cited

U.S. PATENT DOCUMENTS

| | | | |
|---|---|---|---|
| 3,689,357 | 9/1972 | Jordan | 257/524 |
| 4,554,059 | 11/1985 | Short et al. | |
| 4,903,089 | 2/1990 | Hollis et al. | 257/256 |
| 4,962,062 | 10/1990 | Uchiyama et al. | |
| 5,107,315 | 4/1992 | Kumagai et al. | 357/23.15 |

FOREIGN PATENT DOCUMENTS

| | | | |
|---|---|---|---|
| 0317124 | 5/1989 | European Pat. Off. | |
| 5815241 | 1/1983 | Japan | 257/77 |
| WO9111822 | 8/1991 | WIPO | |

OTHER PUBLICATIONS

Appl. Phys. Lett, vol. 56, No. 23, Jun. 1990, M. I. Landstrass, et al. "Total Dose Radiation Hardness of Diamond-based Silicon-on-insulator Structures".

Proceedings of the IEEE, vol. 79, No. 5, May 1991, W. Zhu, et al., "Growth and Characterization of Diamond Films on Nondiamond Substrates for Electronic Applications".

*Primary Examiner*—Sara W. Crane
*Assistant Examiner*—Carl Whitehead, Jr.
*Attorney, Agent, or Firm*—Nixon, Hargrave, Devans & Doyle

[57] ABSTRACT

An integrated circuit structure containing dielectrically isolated islands having heat dissipation paths of enhanced thermal conductivity. A semiconductor structure comprises a first layer of crystalline material with a layer comprising polycrystalline diamond formed over the first layer. A layer of polycrystalline silicon is formed over the diamond containing layer and a layer of monocrystalline material is formed over the polycrystalline silicon.

27 Claims, 2 Drawing Sheets

FIG. 6 BIPOLAR NAND GATE

SILICON ON DIAMOND CIRCUIT STRUCTURE

This application is a continuation of application Ser. No. 07/789,219, filed Nov. 7, 1991, now abandoned.

FIELD OF THE INVENTION

This invention relates to integrated circuitry of the type formed with electrically isolated devices and, more particularly, to a dielectrically isolated structure providing improved circuit capabilities.

BACKGROUND OF THE INVENTION

A variety of techniques have been employed to achieve device isolation in integrated circuitry. These include junction isolation, formation of channel stops with dopant implants and the inclusion of dielectric material, e.g., by local oxidation of silicon. For the silicon planar process the class of dielectric isolation commonly referred to as silicon on insulator (SOI), is used to form individual devices on discrete islands or mesas. Advantages of SOI technology include improved power handling capability, avoidance of latch-up problems associated with junction isolation, and improvements in transistor operating frequency, the latter resulting from lower output capacitance attributable to the dielectric isolation. Generally SOI structures exhibit greater tolerance and immunity to the effects of ionizing radiation and, therefore, are the structure of choice for rad hard environments.

In the past, such dielectrically isolated islands have been formed by thermally growing an oxide layer on a silicon wafer surface and then depositing a relatively thick layer of polycrystalline silicon (polysilicon) over the oxide. The polysilicon layer, sometimes referred to as the handle, is relied upon to provide structural integrity to the overall wafer during subsequent processing. The silicon wafer material is frequently thinned to a thickness of less than 1 mil and polished to provide a starting material for epitaxial silicon growth. This technique is characterized by relatively high temperature processing, consequent high levels of mechanical stress, lattice damage and various nonuniformities across the wafer. See, however, U.S. Pat. No. 4,554,059, assigned to the assignee of the present invention, which teaches an electrochemical technique for improving the wafer yield of integrated circuits formed with dielectrically isolated islands.

Several other SOI techniques are of current interest. These include Separation by IMplantation of OXygen (SIMOX), Zone Melt Recrystallization (ZMR), Full Isolation by the Porous Oxidation of Silicon (FIPOS), Silicon on Sapphire (SOS) and bonded wafers. At this time, SOS and bonded wafer technology have advanced sufficiently to realize commercial feasibility.

A feature common to all of the aforementioned SOI technologies is the relatively low thermal conductivity characteristic of the insulator material. Thus, design considerations based on upper limits for steady state operating temperatures of active devices frequently require inclusion of a cooling zone, i.e., additional heat dissipation volume, within each device island. In addition to having a significant impact on the achievable level of device integration, the added volume of semiconductor material can increase parasitic capacitance thereby degrading overall circuit performance. By way of example, consider that the area size of a bipolar transistor island permits a predetermined level of power dissipation beyond which the operating temperature becomes undesirably high relative to ambient conditions. For one known geometry with island dimensions of 51 microns by 43 microns, a temperature rise on the order of 1° C. will occur with 1.5 mW of steady state power dissipation. In order to increase the power dissipation to 3.75 mW, while still limiting the temperature to 1° C. above ambient, it becomes necessary to increase the island dimensions to 81 microns by 73 microns. That is, approximately 2.5 times the surface area is required in order to dissipate the additional heat. In circuits employing high speed transistors, the required cooling zone can impart other undesirable effects such as parasitic collector-substrate capacitance. Such capacitance such can reduce the circuit frequency response by 20%.

From the above it is apparent that competing demands for increased power handling capability and higher levels of device integration require application specific tradeoffs. This is particularly problematic in view of the current trends to develop standard cell libraries and device arrays each suitable for a wide variety of applications.

SUMMARY OF THE INVENTION

There is now provided an integrated circuit structure containing dielectrically isolated islands having heat dissipation paths of enhanced thermal conductivity. Generally, the integrated circuit structure comprises a first layer of crystalline material and a layer of polycrystalline diamond formed thereover. Polycrystalline silicon is formed over the diamond layer and a layer of monocrystalline semiconductor material is formed over the polycrystalline silicon. In the preferred embodiments, the first layer of crystalline material is a single crystal semiconductor material such as silicon or a compound semiconductor; and the layer of monocrystalline material formed over the polycrystalline silicon is, preferably, a single crystal wafer bonded to the polysilicon.

A method for forming an integrated circuit structure having heat dissipation paths of enhanced thermal conductivity includes forming a layer of polycrystalline diamond over a first surface of a layer of substrate material. A polycrystalline silicon layer is formed over the polycrystalline diamond and a layer of monocrystalline semiconductor material is formed over the polycrystalline silicon.

The interest in employing diamond material as a passive component in an integrated circuit structure is, of course, not new. Growth of single crystal diamond films has not been demonstrated. Moreover, significant lattice mismatch has precluded epitaxial growth of silicon films over monocrystalline diamond.

Efforts to use polycrystalline films in order to realize the electrical and thermal benefits of diamond have previously had significant drawbacks that made high volume commercialization difficult. For example, subsequent to deposition of the diamond film on a silicon wafer, a relatively thick, e.g., 20 mil, polysilicon layer is normally deposited to form a structural backing. Such a backing, or wafer handle, is needed to sustain the integrity of the relatively thin epitaxial silicon layer after thinning or removal of substrate silicon. High temperature processing of the thick polycrystalline handle layer is believed to contribute to wafer warpage.

DESCRIPTION OF THE FIGURES

For a more complete understanding of the invention, reference is made to the following description in conjunction with the accompanying drawings wherein:

FIG. 6 is a schematic illustration of a circuit formed with the structure of FIG. 5.

DETAILED DESCRIPTION OF THE INVENTION

Figure 1:
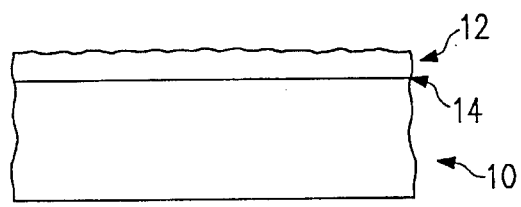
FIGS. 1 through 3 illustrate various stages during formation of a semiconductor structure according to the invention.
Figure 2:
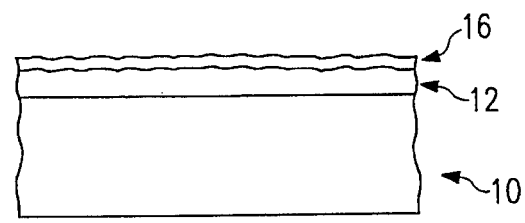
Figure 3:
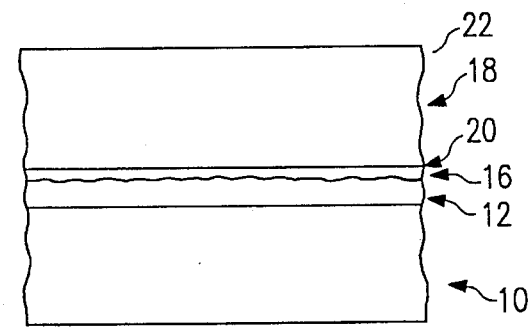

An exemplary process sequence is illustrated in FIGS. 1–3. Fabrication begins with preparation of a wafer substrate for receiving polycrystalline diamond over a surface thereof. FIG. 1 illustrates a monocrystalline silicon wafer 10 having a thin polycrystalline layer 12 formed over a wafer surface 14. For example, a diamond film ranging from 1 to 5 microns in thickness can be deposited by DC, RF or Microwave Plasma Enhanced Chemical Vapor Deposition (CVD) at a deposition pressure ranging from 5 to 100 TORR and at a temperature in the range of 600C. to 1000C. For a more detailed discussion on techniques for forming diamond films on non-diamond substrates, see Zhu, et al. "Growth and Characterization of Diamond Films on Nondiamond Substrates for Electronic Applications" *Proceedings of the IEEE,* Vol. 79, No. 5, May 1991.

With reference to FIG. 2, a thin polycrystalline silicon layer 16, e.g., 1 to 2 microns thick, is next formed over the diamond layer 12. Most preferably, the polysilicon material is formed with a low pressure, chemical vapor deposition technique at a relatively low temperature, e.g., in the range of 600C. Alternately, the deposition can be had by Plasma Enhanced CVD. Thickness of the polysilicon film 16 could be significantly less than 1 micron, and, for example, on the order of 0.1 micron, depending on the smoothness of the underlying diamond surface. Generally, sufficient polycrystalline silicon is formed over the diamond surface to assure satisfactory bonding of the overall structure with a second wafer. It is desirable to minimize stress effects between the polycrystalline silicon film 12 and underlying material and thereby minimize warpage. The film 12 should therefore be of minimum thickness. Of course, by minimizing surface roughness of the diamond layer 12, one can further reduce the thickness of the polysilicon film 16. Choice of a low deposition temperature when forming the film 16 also reduces residual stress.

Next, the polysilicon film is polished to provide a smooth bonding surface for receiving a second wafer. This can be effected with well known techniques such as with a chemical/mechanical polish employing colloidal silica to provide a planar mirror finish.

A crystalline silicon wafer 18, having a smooth polished surface 20 with planarity comparable to that of the film 16, is then bonded to the polysilicon film 16. See FIG. 3. Techniques for bonding a monocrystalline surface with a polycrystalline silicon surface are known. See Jones, et. al., Abstract No. 478, *J. Electrom. Soc.,* Vol. 138, No. 8, August 1991. Bonding should be preceded by a pre-bond surface treatment consisting of, for example, an $H_2SO_4\backslash H_2O_2$ cleaning followed by a second cleaning with $NH_4OH$ and a spin rinse/dry. Enhanced bonding between the polysilicon layer 16 and the wafer surface 20 may be had by formation of oxide at the interface. For example, inclusion of a liquid oxidant, such as water, in a high temperature anneal, e.g., above 900C, in a neutral ambient environment for several hours results in an oxygen bond between lattice silicon and polycrystalline silicon. For further details see U.S. Pat. No. 4,962,062 issued Oct. 9, 1990 and incorporated herein by reference. See, also, U.S. Pat. No. 5,266,135 issued Nov. 30, 1993, assigned to the assignee of the present invention and incorporated herein by reference, disclosing a preferred liquid oxidant for enhancing bonded wafer yield.

If it is desirable to direct bond the polysilicon layer 16 to the wafer 18 without retaining a residual intervening oxide layer, then such bonding may be accomplished by growing the wafer 18 by the float-zone (FZ) method and allowing only native oxide on the surface of the polysilicon film 16 and the wafer surface 20. The surfaces are placed in contact with one another and the structure is annealed at a high temperature. The native oxide will dissolve into the FZ wafer during the anneal because FZ silicon has an extremely low oxygen content. This method of bonding may be desirable when devices are to be fabricated on the side of the bonded structure containing the polysilicon layer 16.

Devices and circuits may be formed on the bonded wafer structure 22 of FIG. 3 with standard processes. Subject to choice of materials, devices may be formed on either or both the substrate 10 and the wafer 18 of the resulting structure for integrated circuit formation. For example, the wafer layer 18 can be ground back and polished to a thickness on the order of 1 micron for subsequent formation of a heavily doped layer underlying subsequent epitaxial growth. Device formation on the side of the bonded wafer having the polysilicon material between the layer 18 and the diamond layer 14 can enhance circuit performance. That is, the polysilicon will getter metallic impurities and crystalline defects. Moreover, low minority carrier lifetime, a characteristic of the polysilicon region, can minimize photocurrent generation in a transient ionizing radiation environment.

The silicon on diamond structure 22 provides several features advantageous to the planar process. The diamond film is an excellent insulator exhibiting a dielectric constant of 5.5 and an electrical resistivity on the order of $10^{16}$ ohm cm. On the other hand, the diamond film exhibits a thermal conductivity on the order of 20 W/cm K. As indicated in the table below, this provides a substantial improvement over the thermal properties characteristic of other materials used in semiconductor circuits.

| Semiconductor or Insulator Material Type | Thermal Conductivity W/(cm K) |
| --- | --- |
| Si | 1.4 |
| $SiO_2$ | 0.014 |
| $Si_3N_4$ (silicon nitride) | 0.185 |
| $Al_2O_3$ (sapphire) | 0.3 |
| diamond | 20. |

ADVANTAGES AND MODIFICATIONS

Figure 4:
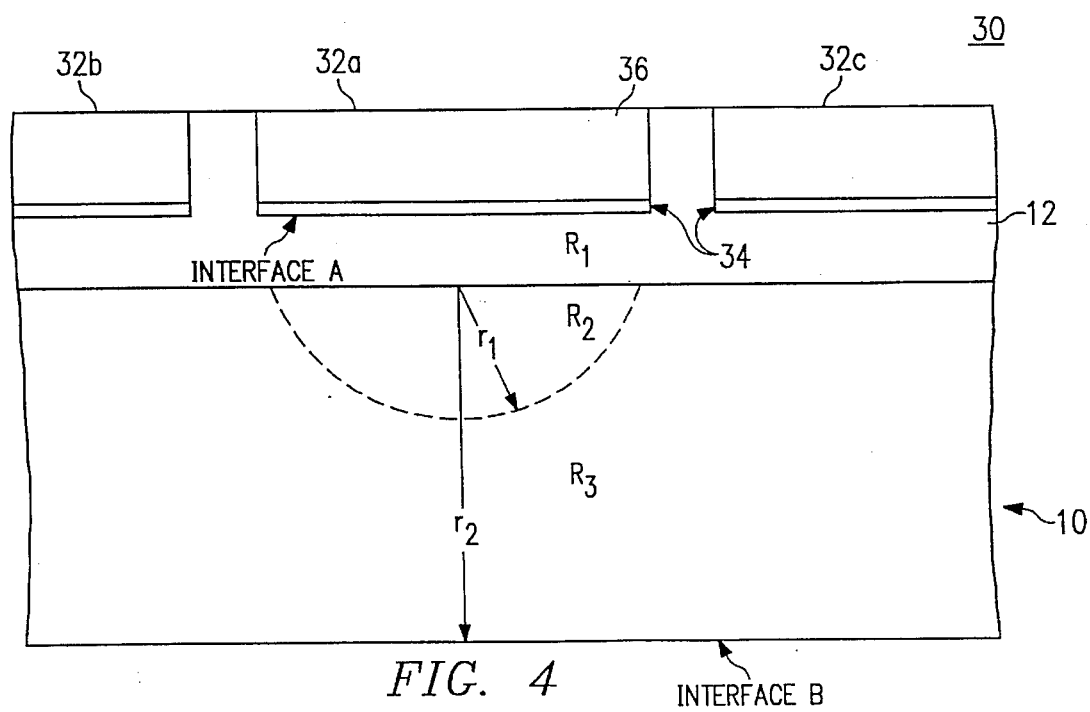
FIG. 4 illustrates a preferred embodiment of the invention.

FIG. 4 illustrates (not to scale) a SOI structure 30 according to the invention, comprising a plurality of rectangular device islands 32 formed over a layer 12 of diamond insulator. Each device island 32 comprises a lower portion 34 corresponding to the polycrystalline silicon layer 16 and an upper portion 36 corresponding to the bonded wafer layer 18 and epitaxial material formed thereon. The device islands 32 may be considered circular in order to simply illustrate advantages of the invention. Other geometries are more common.

The thermal resistance $R_{AB}=R_1+R_2+R_3$, corresponds to a thermal conduction path extending from the interface A, between device island 32a and the diamond layer 14, to an interface B at the lower surface of the crystalline silicon handle substrate 10. Assuming that the interface A is circular, $R_1$ corresponds to the portion of the path extending from the interface A through the diamond layer 14; and $R_2$ corresponds to a hemispherical portion of the path extending into the substrate 10 from the interface between the substrate and the diamond layer 14. In a first order linear approximation, the hemispherical portion is assumed to have a radius $r_1$ equivalent to the radius of a circular interface A with the overlying device island 32a. $R_3$ corresponds to the thermal resistance associated with the remaining thermal conduction path through the substrate 10 to the interface B. The thermal resistances could be approximated as follows:

$$R_1 = \frac{d}{\sigma_i(\pi r_1^2)}$$

$$R_2 = \frac{r_1}{\sigma_{si}(\pi r_1^2)} = \frac{1}{\sigma_{si}\pi r_1} \text{ (linear approximation)}$$

$$R_3 = \frac{1}{2\pi\sigma_{si}}\left(\frac{1}{r_1} - \frac{1}{r_2}\right)$$

wherein:

d= insulator thickness in cm $\sigma_i$= insulator thermal conductivity (W/cm K)

$r_1$= radius of circular interface A $r_2$= substrate thickness $\sigma_{si}$= silicon thermal conductivity By way of example, there may be an insulator thickness, d, of $2\times10^{-4}$ cm, an INTERFACE A radius $r_1$ of $30\times10^{-4}$ cm and a substrate thickness, $r_2$, of $254\times10^{-4}$ cm. If the dielectric material of the structure 30 was silicon dioxide instead of the diamond layer 14, the resulting thermal resistance $R_{AB}$ would be 614K/W. However, with the diamond film 14 the thermal resistance of the structure 30 between INTERFACE A and INTERFACE B is only 109K/W.

For a power dissipation of 3.75 mW, the resulting temperature rise with respect to ambient is on the order of 0.4C. In contrast, the same power dissipation in a structure formed with silicon dioxide dielectric instead of the diamond layer 14 would exhibit a temperature rise of approximately 2.3C above ambient.

From the above example, it is apparent that the SOI structure 30 will allow for substantial increases in power dissipation without requiring dedication of additional semiconductor area for thermal dissipation.

Figure 5:
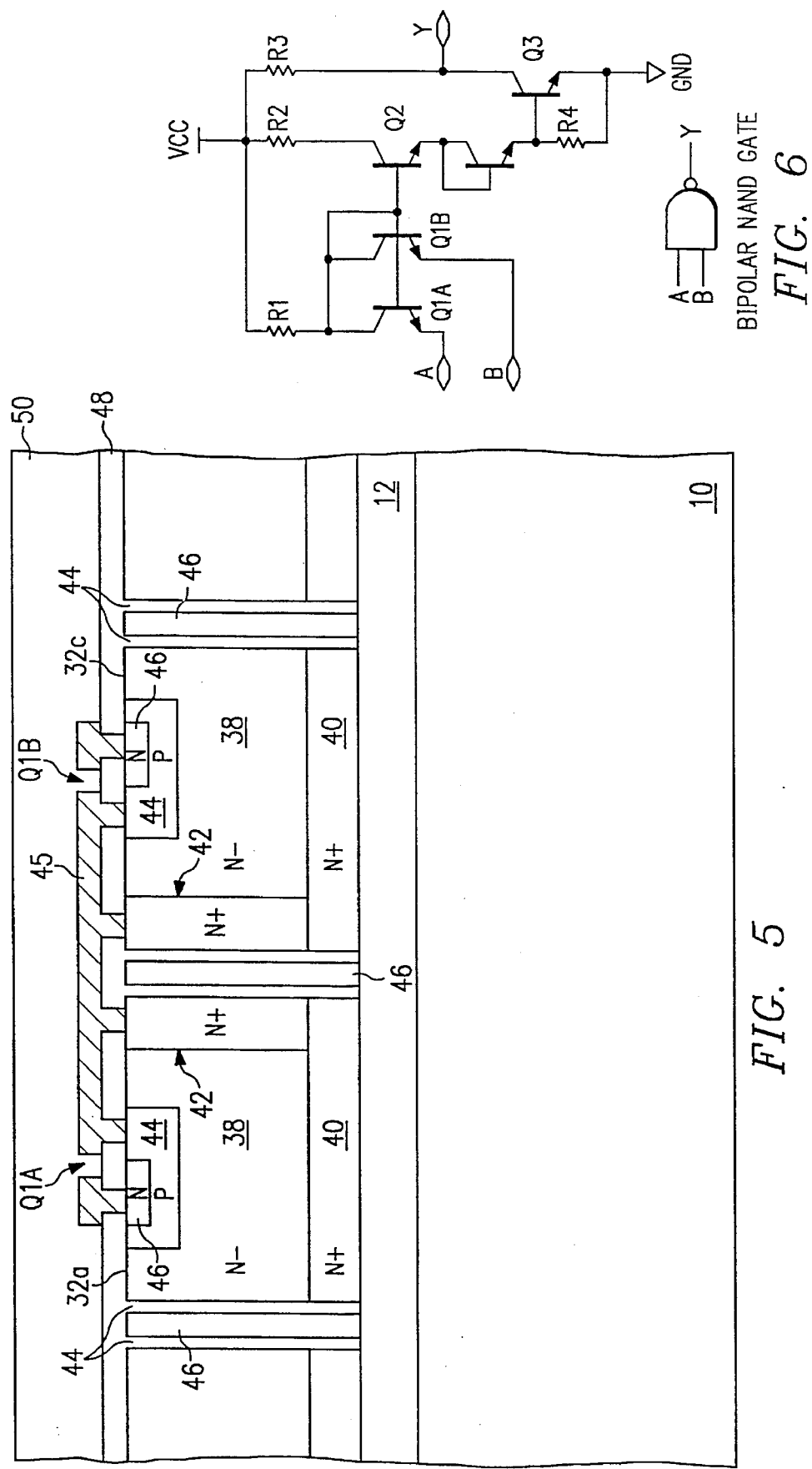
FIG. 5 is a partial view of an integrated circuit structure according to the invention.

FIG. 5 illustrates in partial cross-sectional view integrated circuitry on the structure 30. Devices formed on the islands 32 may be connected into the NAND gate schematically illustrated in FIG. 6. With reference to FIGS. 4, 5 and 6, NAND gate transistor Q1A is formed on island 32a and NAND gate transistor Q1B is formed on island 32c. Each transistor includes a N⁻ collector region 38 formed in the monocrystalline upper portion 36 and a buried N+ region 40 formed in polycrystalline silicon lower portion 34. N⁺ collector contacts 42 extend from the island surface, through the upper portion 36, and down to the buried layer 40. The base regions 44 and emitter regions 46 are formed over the collector regions 38 by implantation and diffusion. See U.S. patent application Ser. No. 07/766,201, filed Sep. 27, 1991, incorporated herein by reference. Interconnect 45, such as may be formed with a metal level or polysilicon deposition, connects the base region 44 of Q1A to the base region 44 of transistor Q1B. Lateral isolation is provided between the islands 32 with a combination SiO₂ 44 and trench filled polysilicon 46, both extending down to the polydiamond layer 14. Further isolation and passivation are provided with a thermally grown oxide layer 48 and a deposited oxide 50, respectively.

Based on the above description, various modifications and alternate embodiments will be apparent. Accordingly, the invention is only to be limited by the claims which follow:

I claim:

1. A semiconductor structure comprising:

a first layer of material having a first surface;

a layer comprising polycrystalline diamond formed on the first surface of the first layer;

a layer of silicon formed on the diamond layer;

a second layer of monocrystalline semiconductor material formed over the layer of silicon, having an integrated circuit formed in said monocrystalline semiconductor material and wherein the layer of silicon comprises polycrystalline silicon and the second layer of monocrystalline semiconductor material includes a first surface bonded to the layer of polycrystalline silicon by intervening oxide bonds.

2. The structure of claim 1 wherein the layers of silicon and monocrystalline semiconductor material are patterned to form multiple electrically isolated device islands, said structure further including a plurality of transistors each formed on a device island, said transistors connected to provide an integrated circuit.

3. The structure of claim 1 wherein the transistors are connected to provide a logic function.

4. The structure of claim 1 wherein the layer of monocrystalline semiconductor material is a crystalline silicon wafer suitable for formation of electronic devices and circuits.

5. A semiconductor structured comprising:

a support layer of material having a first surface;

a layer comprising polycrystalline diamond in direct contact with the first surface of the support layer;

a first silicon layer on the polycrystalline diamond layer; and a second layer of monocrystalline semiconductor material formed over the first silicon layer with one or more integrated circuit structures formed in said monocrystalline semiconductor material.

6. The structure of claim 5 wherein the first silicon layer predominantly comprises polycrystalline silicon.

7. A semiconductor structure comprising:

a first layer of substrate material;

a layer of diamond on the first layer of substrate material;

a layer of silicon on the diamond layer;

a second layer of material on the layer of silicon comprising a monocrystalline material including one or more integrated circuits.

8. The structure of claim 7 wherein said silicon layer comprises polysilicon and said second layer of monocrystalline material is oxide bonded to said polycrystalline silicon.

9. The structure of claim 7 wherein the silicon layer and the monocrystalline layer are patterned to form multiple electrically isolated device islands, said structure further including a plurality of transistors each formed on a device island, said transistors connected to provide an integrated circuit.

10. The structure of claim 9 wherein the transistors are connected to provide a logic function.

11. A semiconductor structure comprising:

a first layer of substrate material;

a layer of diamond over the first layer of substrate material;

a layer of silicon over the diamond layer;

a second layer of material over the layer of silicon and comprising monocrystalline material including an integrated circuit.

12. The structure of claim 11 wherein the silicon layer is polycrystalline silicon.

13. The structure of claim 11 wherein the second layer is oxide bonded to the layer of silicon.

14. The structure of claim 11 wherein the silicon layer and the moncrystalline layer are patterned to form multiple electrically isolated device islands, said structure further including a plurality of transistors each formed on a device island, said transistors connected to provide an integrated circuit.

15. The structure of claim 14 wherein the transistors are connected to provide a logic function.

16. A semiconductor structure comprising:

a planar first layer of substrate material;

a planar layer of diamond over the first layer of substrate material;

a planar layer of silicon over the diamond layer;

a planar second layer of material over the layer of silicon wherein at least one of the first and second layers comprises a monocrystalline material.

17. The structure of claim 16 wherein said silicon layer comprises polysilicon and said layer of moncrystalline material is oxide bonded to said polycrystalline silicon.

18. The structure of claim 16 wherein the silicon layer and the moncrystalline layer are patterned to form multiple electrically isolated device islands, said structure further including a plurality of transistors each formed on a device island, said transistors connected to provide an integrated circuit.

19. The structure of claim 18 wherein the transistors are connected to provide a logic function.

20. The structure of claim 16 wherein said layer of silicon is polysilicon and said second layer is monocrystalline silicon.

21. A semiconductor structure comprising:

a first layer of material having a first surface;

a layer of diamond formed over the first surface;

a layer of silicon formed over the diamond layer; and a layer of monocrystalline material formed on the layer of silicon.

22. The semiconductor structure of claim 21 wherein the layer of monocrystalline material comprises an integrated circuit.

23. The semiconductor structure of claim 21 wherein the first layer of material is monocrystalline silicon and comprises an integrated circuit.

24. The semiconductor structure of claim 21 wherein the second layer of material is oxide bonded to the layer of silicon.

25. A semiconductor structure comprising:

a first layer of material having a first surface;

a layer of diamond formed over the first surface;

a layer of silicon formed over the diamond layer; and a second layer of material is oxide bonded to the layer of silicon, wherein one of said first and second layers is monocrystalline material.

26. The semiconductor structure of claim 25 wherein the second layer of material is monocrystalline silicon and comprises an integrated circuit.

27. The semiconductor structure of claim 25 wherein the first layer of material is monocrystalline silicon and comprises an integrated circuit.

* * * * *